United States Patent
Gradl

(10) Patent No.: US 7,519,139 B1
(45) Date of Patent: Apr. 14, 2009

(54) SIGNAL MONITORING SYSTEMS AND METHODS

(75) Inventor: David A. Gradl, Naperville, IL (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 698 days.

(21) Appl. No.: 11/185,242

(22) Filed: Jul. 20, 2005

(51) Int. Cl.
*H03D 3/24* (2006.01)

(52) U.S. Cl. .................. 375/375; 375/232; 375/345; 375/224; 375/376; 375/230; 713/503; 713/401

(58) Field of Classification Search .................. 375/232, 375/345, 230, 375, 214, 224, 376; 713/503, 713/401
See application file for complete search history.

(56) References Cited

U.S. PATENT DOCUMENTS

| | | | |
|---|---|---|---|
| 6,088,415 A * | 7/2000 | Gaudet | 375/376 |
| 6,570,916 B1 * | 5/2003 | Feldbaumer et al. | 375/232 |
| 7,058,120 B1 * | 6/2006 | Lu et al. | 375/214 |
| 7,279,992 B2 * | 10/2007 | Huang | 331/25 |
| 7,400,675 B2 * | 7/2008 | Moughadghab et al. | 375/232 |
| 2005/0135471 A1 * | 6/2005 | Tonietto et al. | 375/233 |
| 2005/0238092 A1 * | 10/2005 | Ng | 375/224 |

OTHER PUBLICATIONS

J.D.H. Alexander, Clock Recovery From Random Binary Signals, Electronics Letters, Institution of Electrical Engineers, vol. 1, pp. 541-542, Oct. 1975.

* cited by examiner

*Primary Examiner*—Chieh M Fan
*Assistant Examiner*—Eva Puente
(74) *Attorney, Agent, or Firm*—MacPherson Kwok Chen & Heid LLP

(57) ABSTRACT

Systems and methods are disclosed herein to provide signal monitoring techniques. For example, in accordance with an embodiment of the present invention, an integrated circuit includes a phase detector circuit that receives an input signal and samples the input signal to provide binary state signals. A signal monitoring circuit decodes the binary state signals and provides at least one output signal indicating for the input signal path equalization and/or duty cycle distortion.

14 Claims, 3 Drawing Sheets

US 7,519,139 B1

SIGNAL MONITORING SYSTEMS AND METHODS

TECHNICAL FIELD

The present invention relates generally to electrical circuits and, more particularly, to signal monitoring.

BACKGROUND

High-speed signal monitoring is an important function, but may present a difficult problem in electronic systems and related applications. For example, the analog nature and high frequency bandwidth associated with signal monitoring functions generally makes this area of design extremely challenging. Thus, typically it is discovered that even simple signal monitoring algorithms are difficult to implement in a practical manner.

Signal monitoring functions generally would be of significant value to system users in various types of applications (e.g., equipment manufacturing, configuration optimization, performance monitoring, and trouble-shooting). However, conventional techniques to perform signal monitoring may involve specialized laboratory instrumentation and probing setups to provide a one-time measurement of received data signal integrity levels. These conventional techniques are typically only performed during the equipment development phase and are generally expensive and time consuming. An additional drawback is that the external instrument probing of high frequency circuits often introduces signal distortion and adds noise to the measurement. As a result, there is a need for improved signal monitoring techniques.

SUMMARY

In accordance with one embodiment of the present invention, an integrated circuit includes a phase detector circuit adapted to receive an input signal and sample the input signal to provide binary state signals; and a signal monitoring circuit, coupled to the phase detector circuit, adapted to decode the binary state signals and provide at least one output signal indicating for the input signal at least one of a path equalization and a duty cycle distortion.

In accordance with another embodiment of the present invention, an integrated circuit includes means for receiving an input signal and sampling the input signal to provide a plurality of binary state signals; means for decoding at least a subset of the binary state signals to provide a first output signal indicating a lead/lag state of the input signal; and means for decoding the binary state signals to provide at least one signal monitoring output signal indicating at least one of a path equalization and a duty cycle distortion for the input signal.

In accordance with another embodiment of the present invention, a method of providing signal monitoring for an input signal includes receiving an input signal; sampling the input signal; generating binary state signals based on the sampling of the input signal; and decoding the binary state signals to provide at least one signal monitoring output signal indicating at least one of a path equalization and a duty cycle distortion for the input signal.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
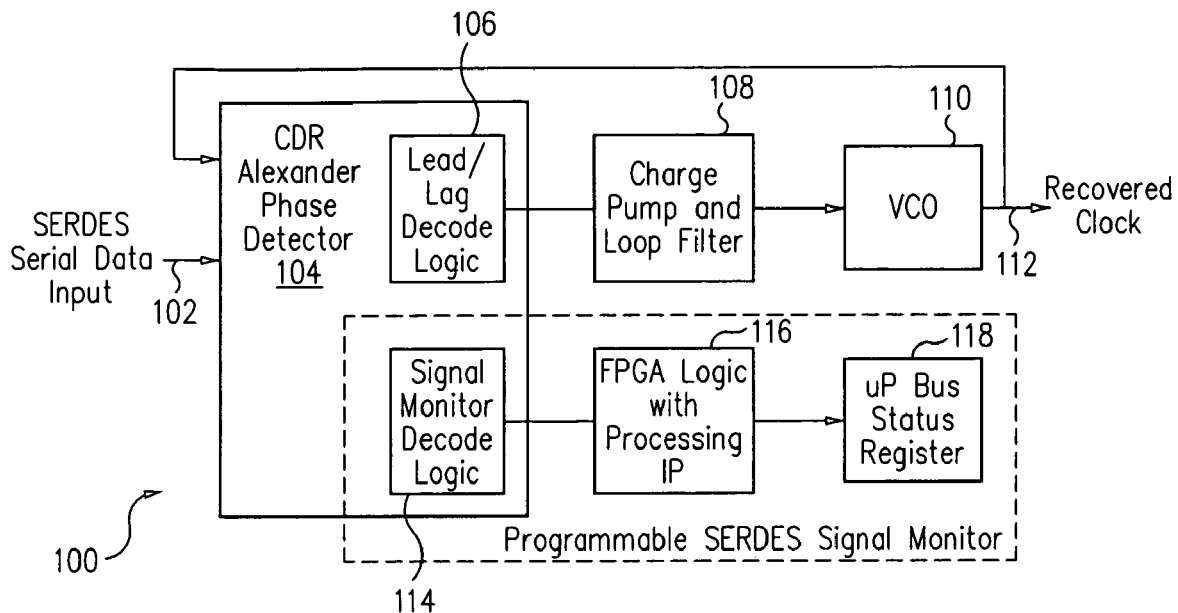
FIG. 1 shows a block diagram illustrating a circuit with signal monitoring in accordance with an embodiment of the present invention.

FIG. 1 shows a block diagram illustrating a circuit 100 in accordance with an embodiment of the present invention. Circuit 100 may represent a portion of a serializer/deserializer (SERDES) circuit along with exemplary functional blocks for providing one or more signal monitoring functions (e.g., programmable SERDES signal monitoring functions) in accordance with one or more embodiments of the present invention. Circuit 100 may be formed as part of an integrated circuit, such as for example a programmable logic device, an application specific integrated circuit (ASIC), or a processor-based system (e.g., a microprocessor or a computer).

Specifically, circuit 100 includes a phase detector 104, a charge pump 108 (e.g., charge pump and loop filter), and a voltage controlled oscillator (VCO) 110, which are typically found within a conventional SERDES circuit. Circuit 100 may further include logic 114, logic 116, and/or at least one register 118 in accordance with one or more embodiments of the present invention.

Phase detector 104 (e.g., an Alexander phase detector, also referred to as a bang-bang phase detector) typically includes logic 106 (e.g., lead/lag decode logic) to aid, for example, in recovering and providing proper timing for a clock signal 112. As an example, phase detector 104 receives an input signal 102 (labeled SERDES serial data input) from which clock signal 112 is recovered (e.g., along with a data signal that is not shown) by performing clock and data recovery and deserialization as would be understood by one skilled in the art.

Figure 2:
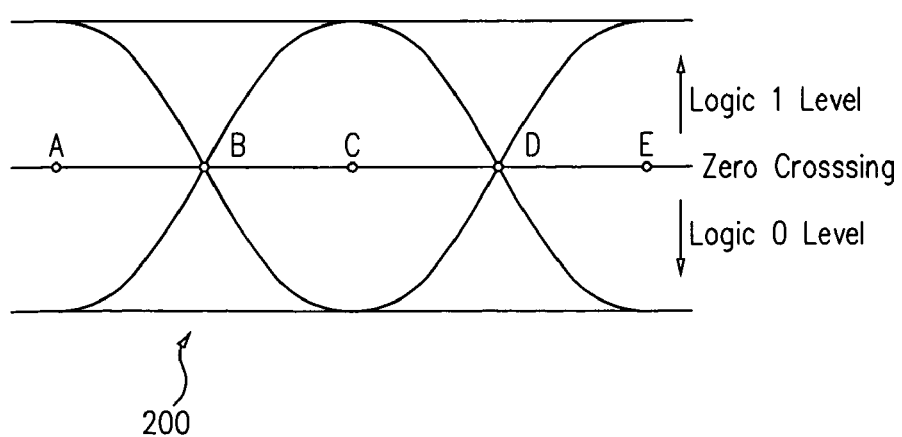
FIG. 2 shows a timing diagram illustrating an eye diagram for an exemplary waveform in accordance with an embodiment of the present invention.

FIG. 2 shows a timing diagram 200 illustrating an eye diagram for an exemplary waveform in accordance with an embodiment of the present invention. Timing diagram 200 illustrates synchronous sampling points A through E for an eye diagram of an exemplary received data signal, such as for example provided as input signal 102.

As an example, phase detector 104 may be utilized to sample the high-speed input serial data of input signal 102 at two times the data rate. These sampling times may be designated by sampling points A, B, C, D, and E as shown in FIG. 2. For example, phase detector 104 may be employed to convert each sample to a binary (i.e., logic 1 or logic 0) state signal (or bit). It should be understood that these binary state signals are generally available or may be conventionally provided within phase detector 104.

Logic 106 of phase detector 104 (of the clock and data recovery circuit (CDR)) may decode specific combinations of these binary state bits to provide lead/lag signals, which controls charge pump 108 to provide a control voltage for VCO 110 (e.g., the PLL VCO). Further details regarding lead/lag (early/late) determination based on binary state signals, for example, may be found in a reference entitled "Clock Recovery From Random Binary Signals" by J. D. H. Alexander, published in *Electronics Letters* (vol. 11, pp. 541-542, October 1975), which is incorporated herein by reference in its entirety and referred to herein as the Alexander reference.

Circuit 100, in accordance with an embodiment of the present invention, further includes logic 114 (e.g., signal monitoring decode logic) to provide signal monitoring (e.g., SERDES signal monitoring). Logic 114, for example, may be implemented within high-speed circuitry (e.g., an ASIC circuit or ASIC-type block of circuit) or within high-speed programmable logic circuitry (e.g., as part of logic 116 if present).

Logic 114 utilizes one or more binary state signals of phase detector 104, which are typically generated or may be generated in high-speed circuits (e.g., high-speed clock and data recovery (CDR) SERDES circuits) as explained herein. Logic 114 may utilize and decode different combinations of these binary state signals to provide various types of information.

For example, the binary state signals may be designated as binary state signals a, b, c, d, and e corresponding to the sampling times A, B, C, D, and E of FIG. 2. These binary state signals a, b, c, d, and e may be utilized, for example, to monitor the effect of path equalization applied to the incoming signal and/or to monitor duty cycle distortion of the incoming signal (i.e., input signal 102) in accordance with one or more embodiments of the present invention.

As an example, in accordance with an embodiment of the present invention, Table 1 provides an exemplary truth table for equalization monitoring of input signal 102. Specifically, Table 1 shows the state combinations of the five binary state signals a, b, c, d, and e, which may be utilized to monitor the effect of path equalization applied to the incoming signal (e.g., input signal 102).

TABLE 1

| a | b | c | d | e | UE | OE |
|---|---|---|---|---|----|----|
| 0 | 0 | 1 | 0 | 0 | 1 | 0 |
| 0 | 1 | 1 | 1 | 0 | 0 | 1 |
| 1 | 0 | 0 | 0 | 1 | 0 | 1 |
| 1 | 1 | 0 | 1 | 1 | 1 | 0 |
| all other combinations | | | | | 0 | 0 |

Signals UE (under equalization) and OE (over equalization) may be generated within phase detector 104 or in the CDR core hardware of the SERDES circuit based on the truth table shown in Table 1. The signal UE would be set to a logical high value (e.g., 1) when an isolated pulse occurs (e.g., 010 or 101) and insufficient high frequency (HF) loss compensation is applied. The signal OE would be set to a logical high value (e.g., 1) when excess compensation is applied.

Figure 3:
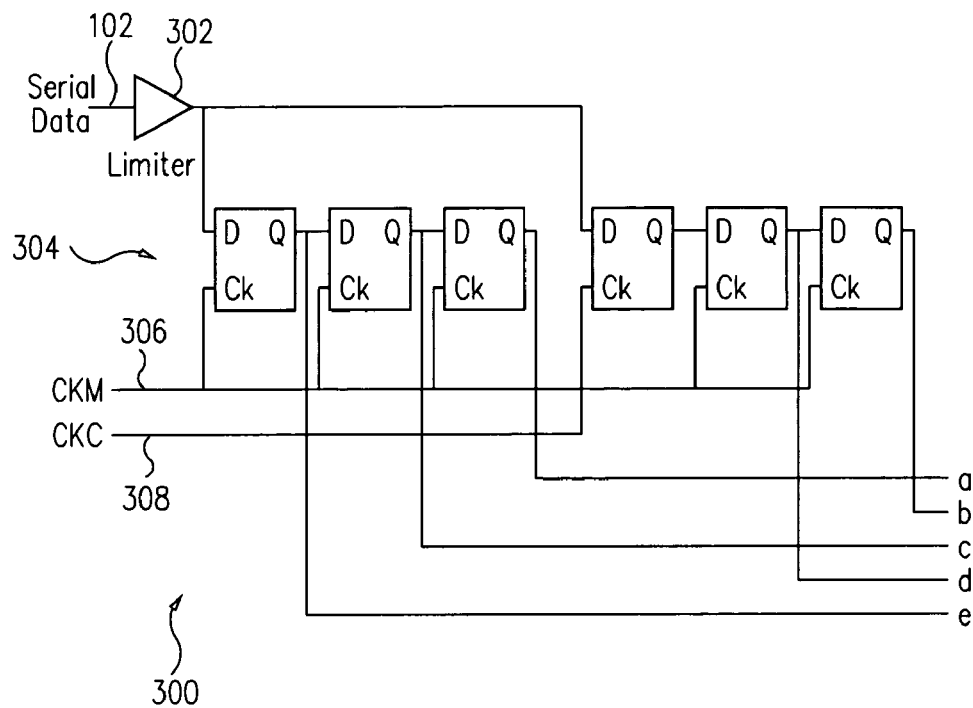
FIG. 3 shows a block diagram illustrating an exemplary circuit for a portion of the circuit of FIG. 1 in accordance with an embodiment of the present invention.

For example, FIG. 3 shows a block diagram illustrating an exemplary circuit 300 for generating the binary state signals a, b, c, d, and e in accordance with an embodiment of the present invention. Circuit 300 includes a limiter 302 and registers 304, with limiter 302 receiving input signal 102 and registers 304 providing the binary state signals a, b, c, d, and e based on an output signal of limiter 302.

Clock signals 306 and 308 (labeled CKM and CKC, respectively) are approximately at a nominal data rate of input signal 102. Clock signal 306 is approximately at midbit instances of input signal 102, while clock signal 308 is approximately at the changeover instances of input signal 102. Thus, complementary square wave clock waveforms and registers 304 provide interleaved sampling, as described in the Alexander reference.

Circuit 300 may be viewed as a modified Alexander phase detector (e.g., a modified Alexander CDR front-end implementation). Circuit 300, for example, may be an exemplary implementation of logic 114 in accordance with an embodiment of the present invention. Alternatively, logic 114 may be combined with logic 106 to provide the desired binary state signals or phase detector 104 may provide the desired binary state signals, which are then utilized by logic 106 and logic 114 to provide their desired functions.

For example, phase detector 104 may generate the binary state signals c, d, and e to determine lead/lag conditions (e.g., by logic 106 and as described in the Alexander reference). Phase detector 104 may also generate the binary state signals a and b, with the binary state signals a, b, c, d, and/or e utilized for signal monitor functions in accordance with one or more embodiments of the present invention.

Figure 4:
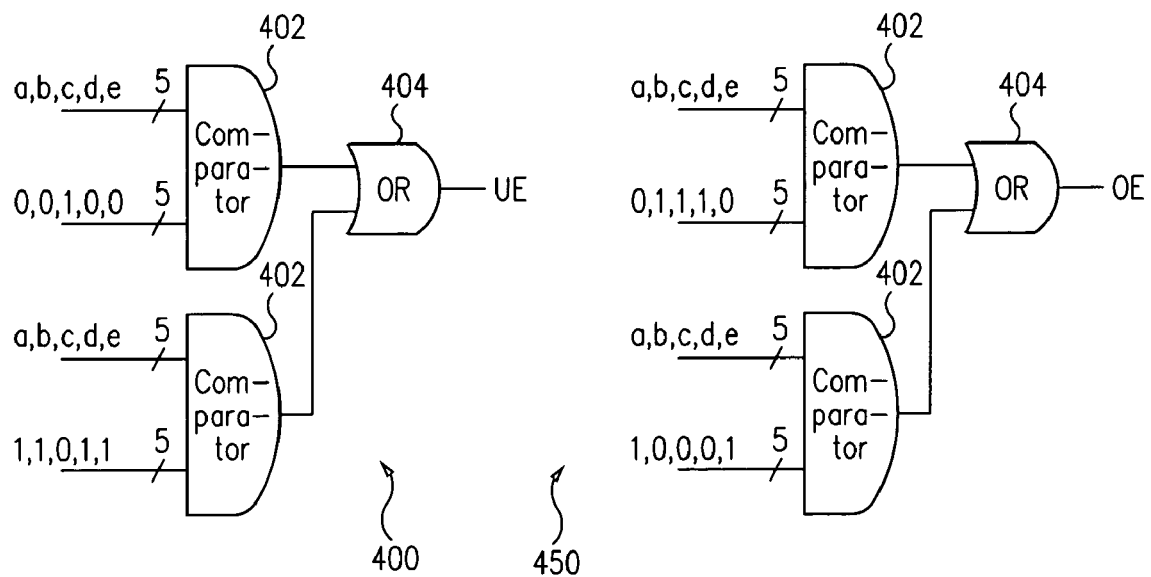
FIG. 4 shows a block diagram illustrating an exemplary circuit for decode logic for a portion of the circuit of FIG. 1 in accordance with an embodiment of the present invention.

For example, Table 1 showed the state combinations of the five binary state signals a, b, c, d, and e, which may be utilized to monitor the effect of path equalization applied to the incoming signal (e.g., input signal 102). As an exemplary implementation, FIG. 4 shows a block diagram illustrating exemplary circuits 400 and 450 for generating the signals UE and OE in accordance with an embodiment of the present invention.

In general, circuits 400 and 450 show exemplary hardware implementations of decoder logic (e.g., logic 114) for equalization monitoring, such as described in reference to Table 1. Circuits 400 and 450 include comparators 402 and logic gates 404 (e.g., OR gates) to provide signals UE and OE, respectively. Comparators 402 receive the binary state signals a, b, c, d, and e and compare to representative corresponding bit patterns (e.g., 0,0,1,0,0 or 1,1,0,1,1 or 0,1,1,1,0 or 1,0,0,0,1 of Table 1) as shown in FIG. 4.

Circuits 400 and 450 may be viewed as detecting single bit wide signal pulses (e.g., at the Nyquist data frequency) and evaluating the bits at the data transition points to generate the signal UE (under equalized) and the signal OE (over equalized) digital signals. Circuits 400 and 450 may be implemented within logic 114, for example. Alternatively, if circuit 100 is incorporated into an integrated circuit having logic functionality, circuits 400 and 450 may be implemented in the logic of the integrated circuit.

For example, if circuit 100 is implemented within a programmable logic device (PLD), such as a field programmable gate array (FPGA) or a complex programmable logic device (CPLD), circuits 400 and 450 may be implemented with the logic of the PLD. For example, as shown in circuit 100, logic 116 may represent the PLD logic for implementing circuits 400 and 450. Furthermore, logic 116 may process the signals UE and OE in a number of different ways, depending upon the specific requirements or desired application.

As an example, logic 116 may provide a single up/down counter or separate leaky-bucket counters for signals UE and OE and/or a data bit counter may be used to normalize (e.g., divide) the results and/or logic 116 may process and translate the signals UE and OE. For example, logic 116 may provide the up/down counter, which is driven by the signals UE and OE to provide noise filtering and possibly a quantized measure of the HF equalization compensation adequacy, as indicated by the count value. The results from logic 116, for example, may be optionally stored or provided (e.g., to a microprocessor) via a circuit 118 (e.g., a microprocessor bus status register and/or a microprocessor) as shown in circuit 100 (FIG. 1).

As another example, in accordance with an embodiment of the present invention, the binary state signals a, b, c, d, and e may be utilized to monitor duty cycle distortion (DCD) of the incoming signal (i.e., input signal 102). As an example, in accordance with an embodiment of the present invention, Table 2 provides an exemplary truth table for DCD monitoring of input signal 102. Specifically, Table 2 shows the state combinations of interest for the five binary state signals a, b, c, d, and e, which may be utilized to monitor DCD for input signal 102.

TABLE 2

| a | b | c | d | e | ND | PD |
|---|---|---|---|---|----|----|
| 0 | 0 | 1 | 0 | 0 | 1  | 0  |
| 0 | 1 | 1 | 1 | 0 | 0  | 1  |
| 1 | 0 | 0 | 0 | 1 | 1  | 0  |
| 1 | 1 | 0 | 1 | 1 | 0  | 1  |
| all other combinations ||||| 0 | 0 |

Each of the rows, shown in Table 2, represents a pattern with correlation to positive or negative duty cycle distortion. Signals PD (positive distortion) and ND (negative distortion), for example, may be hardware (or software) derived and provided to logic 116 and/or circuit 118 for additional processing and translation, as described similarly for signals UE and OE (e.g., in reference to FIGS. 1-4). For example, circuit 300 may provide the binary state signals a, b, c, d, and e, while a modified version of circuits 400 and 450 generate the signals PD and ND (e.g., comparators 402 comparing the binary state signals a, b, c, d, and e to bit patterns as shown in Table 2).

It should be understood that the techniques disclosed herein may be extended to monitor various number of the binary state signals or to provide other signal monitoring functions or characterizations, which may be derived in a similar manner (e.g., using different sets of bit combinations and defining different output signals that may be different than signals UE/OE and PD/ND). For example, the range of possible signal monitor functions may increase by implementing various processing algorithms in logic 114 and/or logic 116. Furthermore, for example, greater signal pattern depth in phase detector 104 (e.g., storing or providing more successive bits of data) may also increase the range of possible signal monitoring functions (e.g., to discern information about the signal jitter and/or decomposition of the jitter components).

Figure 5:
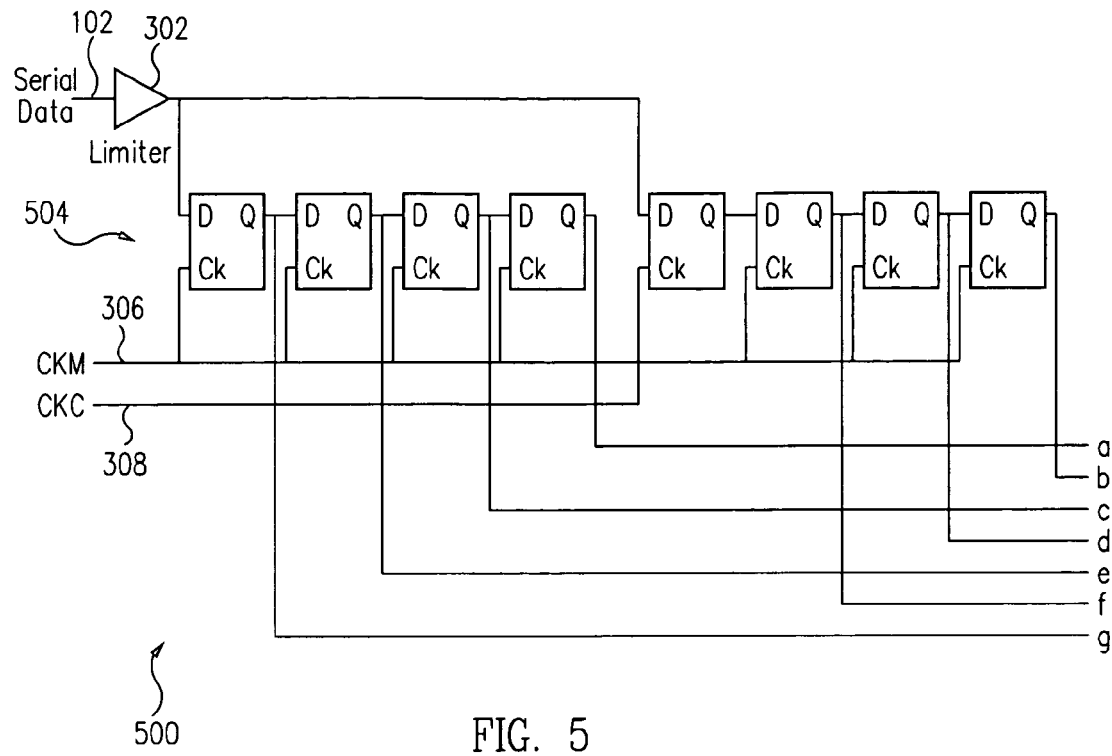
FIG. 5 shows a block diagram illustrating an exemplary circuit for a portion of the circuit of FIG. 1 in accordance with an embodiment of the present invention.

For example, FIG. 5 shows a block diagram illustrating an exemplary circuit 500 for generating binary state signals a, b, c, d, e, f, and g in accordance with an embodiment of the present invention. Circuit 500 is similar to circuit 300 (FIG. 3), but is an extended form to provide the additional binary state signals f and g (e.g., via additional registers for registers 504 relative to registers 304). Circuit 500, for example, may allow greater equalization monitoring functionality, as discussed further herein.

Figure 6:
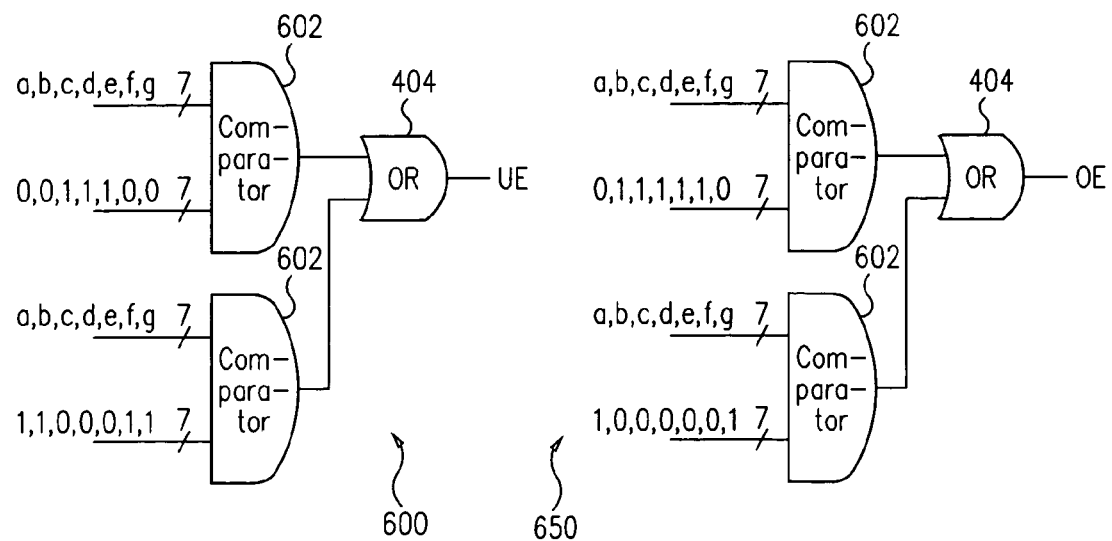
FIG. 6 shows a block diagram illustrating an exemplary circuit for decode logic for a portion of the circuit of FIG. 1 in accordance with an embodiment of the present invention.

As an example, FIG. 6 shows a block diagram illustrating exemplary circuits 600 and 650 for generating the signals UE and OE in accordance with an embodiment of the present invention.

Circuits 600 and 650 are similar to circuits 400 and 450, but circuits 600 and 650 provide equalization monitoring that is sensitive to a lower data frequency.

For example, circuits 600 and 650 provide a lower frequency equalization monitoring function by detecting two-bit wide signal pulse patterns and evaluating the bit values at the data transition times. Consequently, circuits 600 and 650 estimate the level of signal equalization at a lower data frequency (e.g., one half of Nyquist data frequency). It should be further understood that greater pattern depth implementations could extend these techniques to even lower frequencies. Furthermore, these techniques could also be applied to the DCD monitoring described in reference to Table 2.

Systems and methods are disclosed herein to provide signal monitoring techniques. For example, in accordance with an embodiment of the present invention, a built-in, low cost technique is provided for monitoring the critical SERDES high-speed serial data signal at a device input port. As an example, a SERDES clock and data recovery (CDR) circuit is provided with modifications to permit the capture of specific signal timing information (e.g., in digital form). This information may be provided, for example, to a logic section of the device (e.g., within a PLD) to be processed into specific signal and data monitoring parameters, which may be stored in memory and/or provided on a data bus (e.g., a system microprocessor bus).

The techniques disclosed herein, for example, may provide system developers with a viable solution to the high-speed signal-monitoring problem. The techniques may provide advantageous features for monitoring high-speed SERDES signals and, for example, provide significant monitoring function flexibility if the data is processed (e.g., by a PLD or other type of logic circuit, such as a processor).

The techniques may be implemented in a non-disruptive fashion by utilizing existing critical analog sampling circuitry, which may be present in a typical SERDES CDR.

Furthermore, as an example, the techniques disclosed may only require a minimal amount of additional digital decoding circuitry in the SERDES core, which may keep added manufacturing costs to a minimum. It should also be understood that the techniques disclosed herein may be applied also to an input signal provided to circuitry other than SERDES circuitry. For example, circuits 300 and 500 may be implemented within non-SERDES circuitry to provide binary state signals from an input signal to logic for monitoring equalization and/or duty cycle distortion, as disclosed herein.

Embodiments described above illustrate but do not limit the invention. It should also be understood that numerous modifications and variations are possible in accordance with the principles of the present invention. Accordingly, the scope of the invention is defined only by the following claims.

I claim:
1. An integrated circuit comprising:
a phase detector circuit adapted to receive an input signal and sample the input signal over time to provide five or more binary state signals;
wherein the phase detector circuit comprises:
a limiter; and a plurality of registers coupled to the limiter, wherein the limiter and the plurality of registers provide interleaved sampling to provide the binary state signals; and a signal monitoring circuit, coupled to the phase detector circuit, adapted to decode the binary state signals and provide output signals indicating for the input signal at least one of a path equalization and a duty cycle distortion;

wherein the signal monitoring circuit comprises:

a first comparator adapted to receive the binary state signals to compare to a first defined bit pattern to provide a first comparator output signal;

a second comparator adapted to receive the binary state signals to compare to a second defined bit pattern to provide a second comparator output signal; and logic gates adapted to receive the first and second comparator output signals and provide output signals indicating for the input signal at least one of the path equalization and the duty cycle distortion.

2. The integrated circuit of claim 1, wherein the phase detector circuit forms part of a serializer/deserializer circuit, wherein the integrated circuit further comprises:

a charge pump coupled to the phase detector;

a voltage controlled oscillator coupled to the charge pump; and wherein the signal monitoring circuit is further adapted to decode at least a subset of the binary state signals to provide a first output signal to the charge pump indicating for the input signal a lead or a lag condition.

3. The integrated circuit of claim 1, further comprising a logic circuit adapted to receive the output signals and provide at least one of an up/down count, a leaky bucket count, a noise filtering, and a measure of a high frequency equalization compensation adequacy.

4. The integrated circuit of claim 1, wherein the phase detector circuit comprises an alexander phase detector and the integrated circuit comprises a programmable logic device.

5. The integrated circuit of claim 1, wherein a first subset of the registers is further adapted to receive a first clock signal at approximately a midbit point of the input signal and a second subset of the registers is further adapted to receive a second clock signal at approximately a changeover point of the input signal.

6. The integrated circuit of claim 1, wherein increasing the number of the binary state signals provides lower frequency path equalization monitoring capability.

7. The integrated circuit of claim 1, wherein the first or second defined bit pattern comprises at least one of a 0,0,1,0,0, a 1,1,0,1,1, a 0,1,1,1,0, and a 1,0,0,0,1 for the path equalization.

8. The integrated circuit of claim 1, wherein the first or second defined bit pattern comprises at least one of a 0,0,1,0,0, a 0,1,1,1,0, a 1,0,0,0,1, and a 1,1,0,1,1 for the duty cycle distortion.

9. A method of providing signal monitoring for an input signal, the method comprising:

receiving an input signal;

sampling the input signal over time;

generating simultaneously, using interleaved sampling, five or more binary state signals based on the sampling of the input signal; and decoding the binary state signals, by comparing the binary state signals to a plurality of defined bit patterns, to provide at least one signal monitoring output signal indicating at least one of a path equalization and a duty cycle distortion for the input signal; wherein the comparing is performed by a signal monitoring circuit comprises:

a first comparator adapted to receive the binary state signals to compare to a first defined bit pattern to provide a first comparator output signal;

a second comparator adapted to receive the binary state signals to compare to a second defined bit pattern to provide a second Comparator output signal; and logic gates adapted to receive the first and second comparator output signals and provide output signals indicating for the input signal at least one of the path equalization and the duty cycle distortion.

10. The method of claim 9, further comprising:

generating a first clock signal at approximately a midbit point of the input signal; and generating a second clock signal at approximately a changeover point of the input signal, wherein the first clock signal and the second clock signal are used for the generating of the binary state signals.

11. The method of claim 9, wherein the signal monitoring output signal, indicating the path equalization for the input signal, provides an under equalization signal and an over equalization signal.

12. The method of claim 9, wherein the signal monitoring output signal, indicating the duty cycle distortion for the input signal, provides a positive distortion signal and a negative distortion signal.

13. The method of claim 9, further comprising decoding at least a subset of the binary state signals to provide a timing output signal indicating a lead/lag condition for the input signal.

14. The method of claim 9, further comprising processing the at least one signal monitoring output signal to provide at least one of an up/down count, a leaky bucket count, a noise filtering, and a measure of a high frequency equalization compensation adequacy.

* * * * *